United States Patent
Pan

(10) Patent No.: US 7,199,659 B2
(45) Date of Patent: Apr. 3, 2007

(54) NON-MATCH POWER AMPLIFIER AND METHOD FOR INCREASED OUTPUT 1 DB COMPRESSION POINT

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 36 days.

(21) Appl. No.: 10/951,793

(22) Filed: Sep. 29, 2004

(65) Prior Publication Data

US 2006/0049872 A1 Mar. 9, 2006

Related U.S. Application Data

(60) Provisional application No. 60/606,927, filed on Sep. 3, 2004.

(51) Int. Cl.
*H03F 3/45* (2006.01)
(52) U.S. Cl. .................. 330/252; 330/261
(58) Field of Classification Search ........... 330/252, 330/261, 301
See application file for complete search history.

(56) References Cited

U.S. PATENT DOCUMENTS

| | | | | |
|---|---|---|---|---|
| 6,133,793 | A * | 10/2000 | Lau et al. .................. 330/302 |
| 6,366,166 | B1 * | 4/2002 | Belot .......................... 330/252 |
| 6,888,411 | B2 * | 5/2005 | Behzad et al. ............. 330/311 |
| 2006/0028275 | A1 * | 2/2006 | Bhattacharjee et al. ..... 330/254 |
| 2006/0232342 | A1 * | 10/2006 | Floyd et al. ................ 330/305 |

* cited by examiner

*Primary Examiner*—Robert Pascal
*Assistant Examiner*—Hieu Nguyen
(74) *Attorney, Agent, or Firm*—Squire, Sanders & Dempsey L.L.P.

(57) ABSTRACT

The invention enables an increase in linear power output ranges in a power amplifier by using an unmatched power amplifier driver in place of a matched power amplifier driver.

12 Claims, 4 Drawing Sheets

$w = 1/SQRT(LC) = 2*PI*2.5GHz$
$Q = 2*pi*2.5GHz*L/R = 7$
$L = 1.8e-9$
$R = 4$
load seen by Op, On = $Q*Q*R \sim 200$

NON-MATCH POWER AMPLIFIER AND METHOD FOR INCREASED OUTPUT 1 DB COMPRESSION POINT

CROSS REFERENCE TO RELATED APPLICATION

This application claims priority to and incorporates by reference U.S. Provisional Patent Application No. 60/606,927, filed Sep. 3, 2004, entitled "Non-Match PA Design for 15 dBm Output 1 DB Compression Point" by inventor Meng-An Pan.

BACKGROUND

1. Technical Field

This invention relates generally to wireless communication systems, and more particularly, but not exclusively, to a non-match PAD design for 15 dBm output 1 dB compression point.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

The IEE 802.11 g standard uses Orthogonal Frequency Division Multiplexing (OFDM) modulation that has data information in both the amplitude and phase. In order not to degrade the modulation quality, the transmitter has to be operated 10 dB lower than the 1 dB compression point of the transmitter. That is, the operating output power backs off by 10 dB of its 1 dB compression point. The design target is to send out 5 dBm output power, which means the transmitter has to be linear up to 15 dBm. That is, the transmitter and thus the power amplifier driver (PAD) (the last stage of the transmitter) has to be designed with output 1 dB compression point equal to or more than about 15 dBm. A balun coupled to the PAD combines the differential signal and then sends it to a power amplifier if extra output power is required.

Accordingly, a new method of choosing PAD load (non-match load) is needed to achieve the required linear output power.

SUMMARY

Embodiments of the invention enable an output power linear up to 15 dBm, by using a non-match load design instead of a match load design. The non-match load PAD design achieves linear output power up to 15 dBm while the load match PAD design only achieves output power linear up to 10.5 dBm. Specifically, a higher 1 DB compression point in a PAD is enabled by AC coupling a power amplifier to a 50 ohm load directly instead of using a LC matching circuit to transform a 50 ohm load impedance into a 200 ohm impedance to match the source impedance.

In an embodiment of the invention, the power amplifier driver comprises a differential pair coupled to a differential inductor. In the electrical equivalent, the power amplifier driver comprises 2 branches (differential, one positive and one negative) with each branch having an on-chip inductor as the load and with a capacitor interspersed between the on-chip inductor and the resistors; the resistors are not matched.

In an embodiment of the invention, the method comprises presenting a load to each branch of a power amplifier driver (composed of 2 branches, differential design), with each branch having an on-chip inductor as the load and with a capacitor interspersed between the on-chip inductor and the resistors are not matched.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
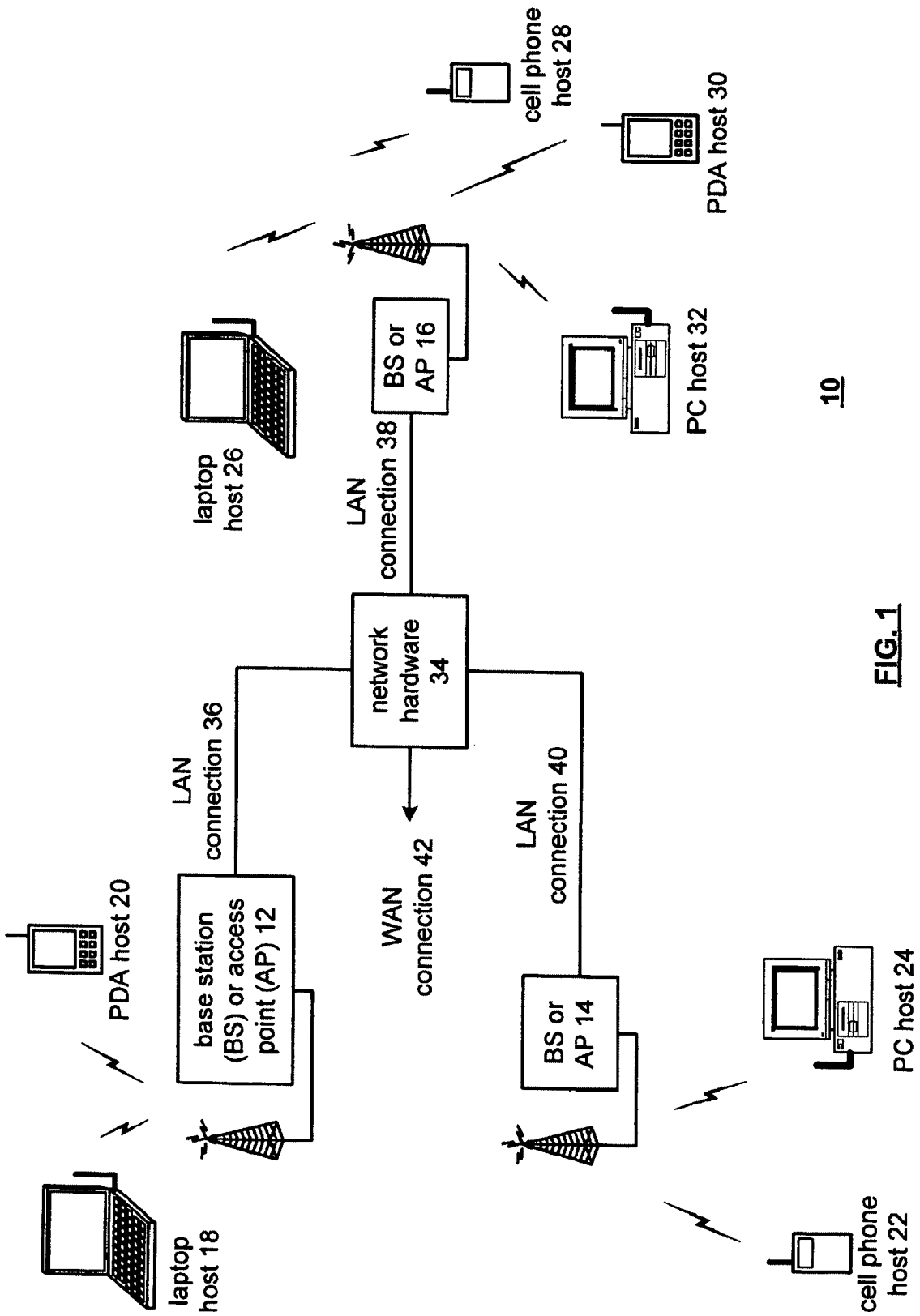
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power.

Figure 2:
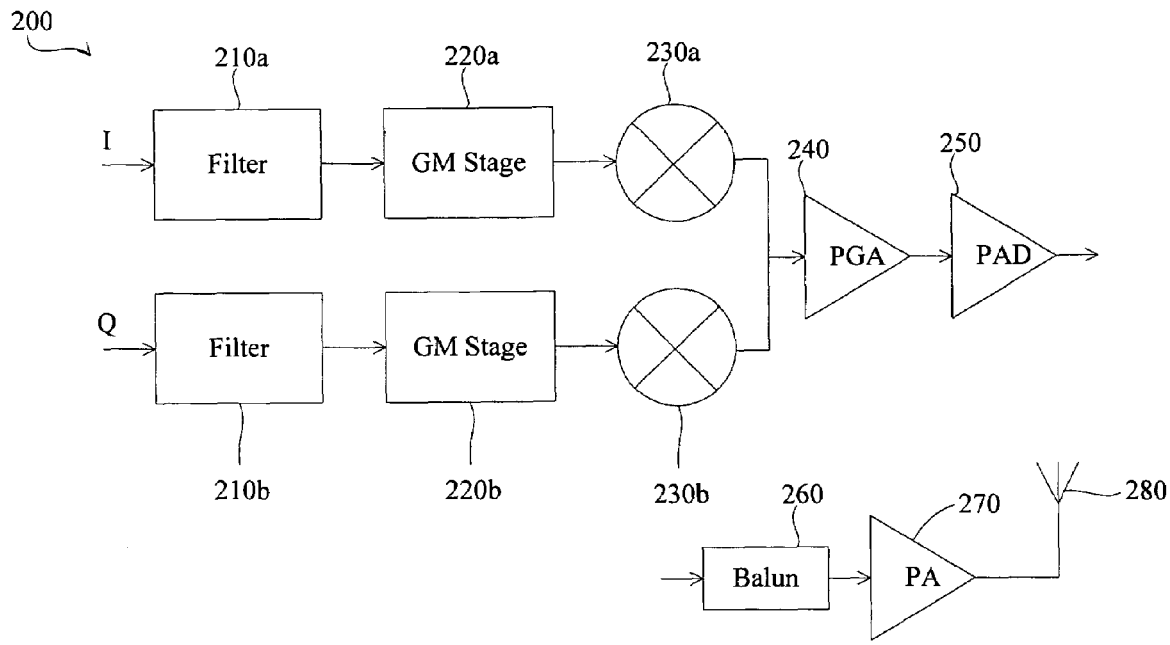
FIG. 2 is a block diagram illustrating a section of a transmitter.

FIG. 2 is a block diagram illustrating a section of a transmitter 200. The transmitter 200 includes digital to analog processing circuitry (not shown), communicatively coupled to I and Q branches. The I and Q branches each include a filter 210a and 210b respectively, a Gm stage 220a and 220b respectively and a mixer 230a and 230b respectively. The mixers 230a and 230b are communicatively coupled to a programmable gain amplifier (PGA) 240, which is communicatively coupled to a power amplifier driver (PAD) 250, which is communicatively coupled to a balun 260, which is communicatively coupled to a power amplifier 270, which is communicatively coupled to an antenna 280. The PAD 250 acts as a power amplifier (PA) and is referred to as a PAD to distinguish it from the PA 270.

After digital to analog processing, as is known in the art, the filters 210a and 210b, which may include low pass filters, filter the I and Q currents. The GM stages 220a and 220b then convert the voltage signals into current signals, which are up converted into 2.5 GHz signal via the mixers 230a and 230b in one embodiment. The PGA 240 provides the gain that amplifies the signals, and the PAD 250 then drives the balun 260 that combines the differential output signal into single ended signal. The balun 260 presents a load of 50 ohm to each side to the PAD 250. An external power amplifier 270 can be used if more output power (more than 5 dBm) is required.

Figure 3:
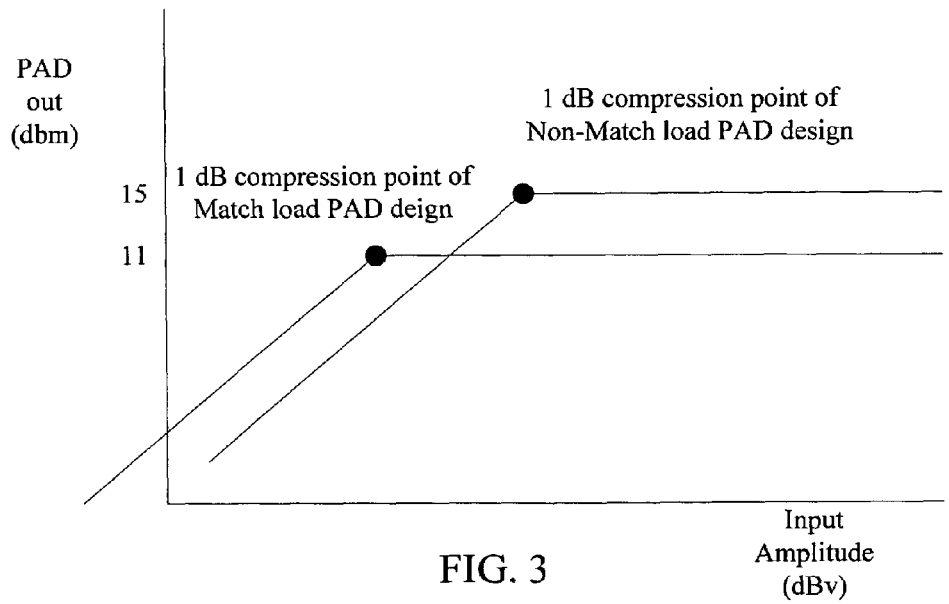
FIG. 3 is a graph illustrating linear output of a matched power amplifier driver versus an un-matched power amplifier driver of the transmitter.

FIG. 3 is a graph illustrating linear output of a matched PAD versus a non-matched PAD 250 of the transmitter 200. A conventional matched PAD only gives more output when the input signal is small but becomes output swing limited when the input gets stronger. Specifically, the conventional PAD's 1 db compression point is 10.5 dBm under this process/power supply. In contrast, the non-match (or un-match) PAD 250 gives more linear output. Specifically, in one embodiment of the invention, the PAD 250 has a 1 db compression point of around 15 dBm under this process/power supply. The number 10.5 dBm and 15 dBm will be explained shortly.

Figure 4A:
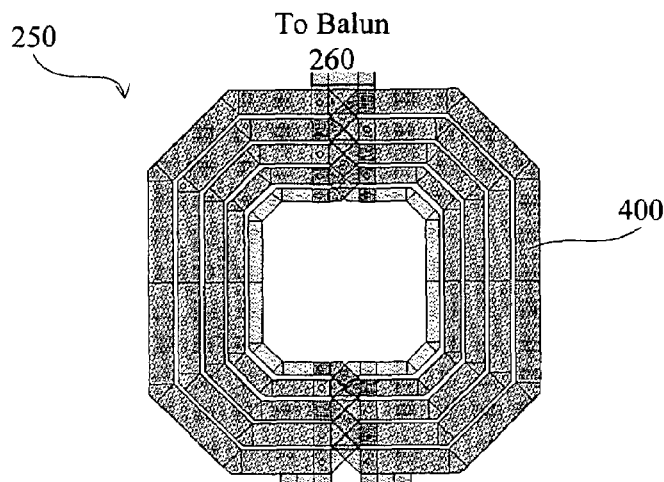
FIGS. 4A and 4B are diagrams illustrating the power amplifier driver.
Figure 4A:
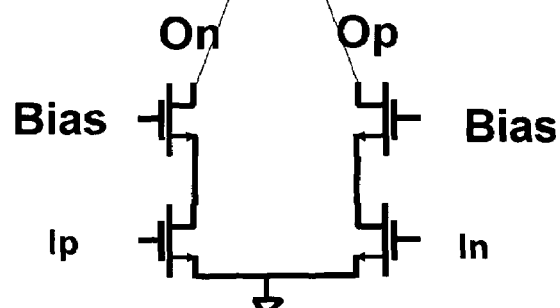
Figure 4B:
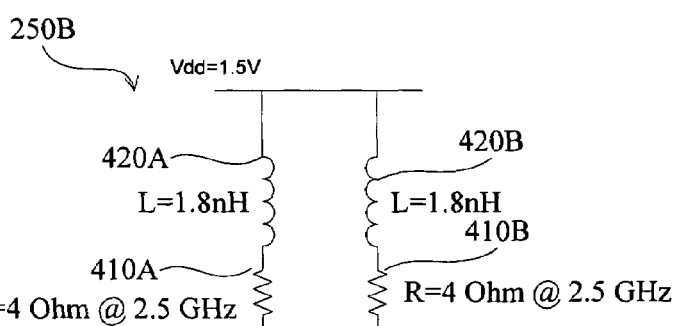
Figure 4B:
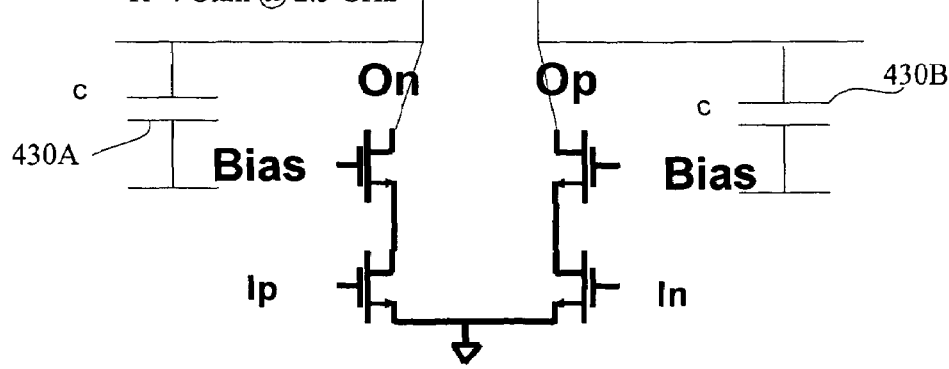

FIGS. 4A and 4B are diagrams illustrating the power amplifier driver 250. The PAD 250 comprises a differential pair coupled to a differential inductor 400 via an optional bias transistor, wherein L is about 1.8 n and Q is about 7 to about 8. At about 2.5 GHz (the operating frequency, the transmitter band is around 2.5 GHz), the imaginary part of the impedance is 0 and the real part of the impedance is about 200. With the inductor tunes out whatever capacitive load at 2.5 GHz, the equivalent load seen by the PAD is an impedance of 200+j*0. That is the PAD output sees a load impedance with real part=200 and imaginary part=0.

FIG. 4B is schematic of FIG. 4A. The differential inductor 400 comprises two branches, each branch having a resistor 410 (410A and B) coupled to an inductor 420 (420A and B) in series. The resistors 420 have a resistance of 4 Ohms at 2.5 GHz while the inductors 410 have an inductance of 1.8 nH. The top end of the inductors 420 are connected to a power supply=1.5 Volt for both sides. The resistors 410 A and B are also each coupled to a capacitor 430 A and B respectively.

The balun 260 will present a load of 50 ohm to the PAD 250. There will be signal coming out of the differential pair OP/ON (and sitting on top of the resistor 510 in FIG. 5). Power is defined as Pavg=Vamp*Vamp/2/R and R=50. That's where the power is (node 510 in FIG. 5). There is a AC coupling capacitor (cap) 430A and B between the PAD and the 50 ohm load. At frequency of 2.5 GHz, the impedance of this AC coupling cap is ~0. That is to say (in terms of signal at 2.5 GHz) before the AC cap and after the AC cap they are short. That is whatever signal appears before the AC cap will appear after the ac cap. That is, power after the AC cap=V*V/2/R equals the power before the AC cap which is the output of the PAD(OP/ON in FIG. 4A/B). That is to say the power at the output of PAD (OP/ON in FIG. 4A/B) is sent across the AC cap and arrives at the input of the balun 260 and gets combined.

Figure 5:
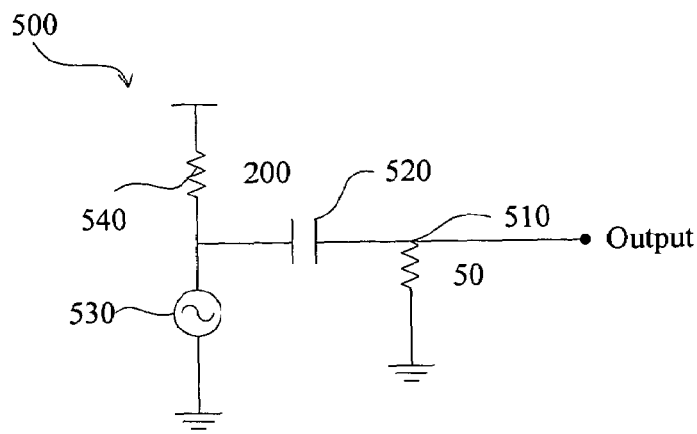
FIG. 5 is a diagram illustrating the electrical equivalent of a branch of the power amplifier driver.

FIG. 5 is a diagram illustrating the electrical equivalent of a branch 500 of the power amplifier driver 250. The branch 500 is equivalent to a branch of the PAD 250 of FIG. 4A and FIG. 4B. The power amplifier driver comprises of 2 branches (differential, one positive and one negative) with each branch having on-chip inductor 530 as the load and with a capacitor 520 interspersed between the on-chip inductor 530 and the resistors 510 and 540; the resistors are not matched. Because of LC tuning, only a resistor of 200 Ohms is left. The MOS transistor is equivalent to the signal source; the L will tune out whatever parasitic capacitor at the output at the operating frequency ~2.5 GHz and only $z=200+j*0=200$ left which is equivalent to a resistor load of 200 ohm. In contrast to a conventional power amplifier driver, the branch 500 is unmatched, i.e., there is no impedance matching between the 200 Ohm resistor and 50 Ohm resistor. In place of impedance matching circuitry is a capacitor so that the 50 Ohm load does not get transformed to 200 Ohm, thereby increasing the maximum Linear Power Out to 13 dbm per branch (accordingly, for 2 branches, the maximum linear output is 16 dbm). During operation, the balun 260 will present a load of 50 ohm to the PAD 250 (each side), and the power at the PAD 250 output is combined by the balun 260. At the PAD output there will be a total power of 16 dBm and the balun 260 just combines them into a single ended signal with the same power 16 dBm, and then sends it to the optional power amplifier for extra power if required. An optional power amplifier 270 is used if extra power (more than 5 dBm output) is required and then the signal is sent to the antenna 280.

This design is using a TSMC 0.18 process with power supply=1.5 v. With a non-match load design: max linear output power each side ~1.5* 1.5/2/50=0.0225W=22.5 mW. The max linear output power of two side combined ~1.5*1.5/2/50*2=0.0225W*2=45mW=10*log10(45)=16.5 dBm. In contrast, for a match load design: the max linear output power each side ~1.5*1.5/2/200=0.005625 W=5.625 mW and the max linear output power of two sides combined ~1.5*1.5/2/200*2=0.005625W*2=11.25mW=10*log10 (11.25)=10.5dBm.

Figure 6:
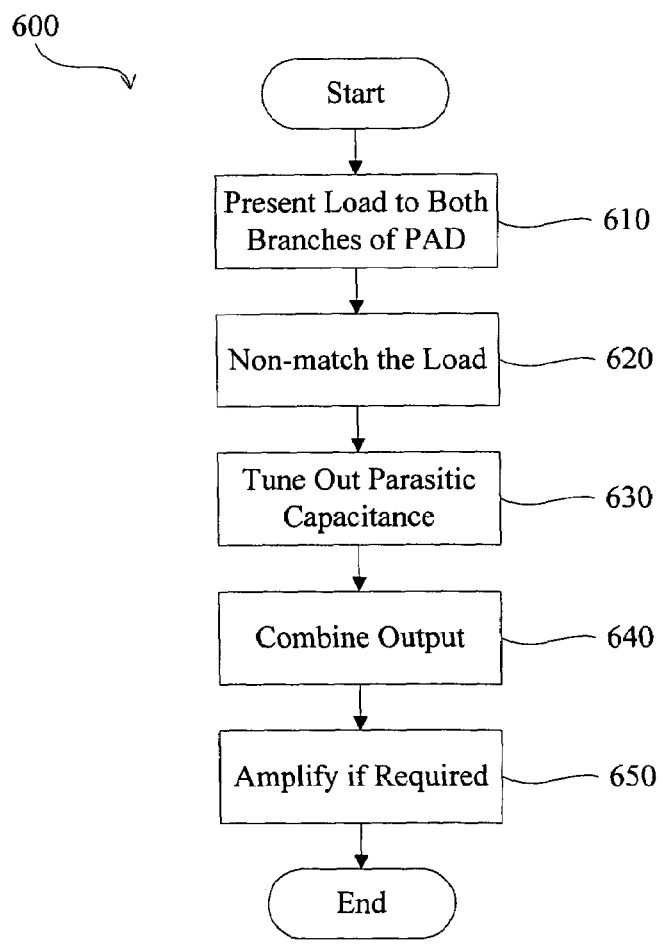
FIG. 6 is a flowchart illustrating a method of increasing linear output in a power amplifier.

FIG. 6 is a flowchart illustrating a method 600 of increasing linear output in a power amplifier. First, a load of 50 Ohms is supplied (610) to both branches of a nonmatched (620) PAD, e.g., with a resistor of 200 Ohms. Parasitic capacitance is then tuned (630) out at the output frequency (e.g., 2.5 GHz). The output of the two branches of the PAD are then combined (640) and the signal amplified (650) if necessary. The method 600 then ends.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A power amplifier, comprising:
 a differential pair;
 a pair of differential inductors coupled to the differential pair and to a power supply;
 wherein the pair of differential inductors is not matched relative to an external load; and
 wherein the power amplifier tunes out parasitic capacitance.

2. The power amplifier of claim 1, wherein output of the differential pair is combined.

3. The power amplifier of claim 1, wherein the differential pair includes a positive and a negative branch.

4. The power amplifier of claim 3, wherein an electrical equivalent of each branch of the driver includes a capacitor interspersed between two unmatched resistors.

5. The power amplifier of claim 4, wherein the two unmatched resistors include a 50 Ohm resistor and a 200 Ohm resistor.

6. A transmitter having a power amplifier according to claim 1.

7. A method, comprising:
 presenting a load to a differential pair of a power amplifier;
 wherein the differential pair is coupled to a pair of differential inductors, which is coupled to a power supply.
 wherein the pair of differential inductors is not matched relative to an external load; and
 wherein the power amplifier tunes out parasitic capacitance.

8. The method of claim 7, further comprising combining the output of the differential pair.

9. The method of claim 7, wherein the differential pair includes a positive and a negative branch.

10. The method of claim 9, wherein an electrical equivalent of each branch of the amplifier includes a capacitor interspersed between two unmatched resistors.

11. The methods of claim 10, wherein the two unmatched resistors include a 50 Ohm resistor and a 200 Ohm resistor.

12. A system, comprising:
 means for presenting a load to a differential pair of a power amplifier;
 wherein the differential pair is coupled to a pair of differential inductors, which is coupled to a power supply
 wherein the pair of differential inductors is not matched relative to an external load; and
 wherein the system tunes out parasitic capacitance.

* * * * *